United States Patent [19]

Schultz

[11] 3,836,697

[45] Sept. 17, 1974

[54] HIGH CURRENT INTERCONNECTION ASSEMBLY IN A MICROCIRCUIT PACKAGE

[75] Inventor: Warren J. Schultz, Barneveld, N.Y.

[73] Assignee: General Electric Company, Utica, N.Y.

[22] Filed: Apr. 21, 1971

[21] Appl. No.: 135,841

[52] U.S. Cl. .............. 174/68.5, 29/626, 174/DIG. 3, 317/101 CC

[51] Int. Cl. .............................................. H05k 3/30

[58] Field of Search ............ 174/68.5, DIG. 3, 52 S, 174/52 PE; 317/101 A, 101 CC, 101 CM, 101 CP, 101 CE, 234 G, 234 H, 234 M, 234 N; 339/17 CF; 29/626, 627

[56] References Cited

UNITED STATES PATENTS

| | | | |
|---|---|---|---|
| 3,619,734 | 11/1971 | Assour | 174/52 S X |
| 3,711,778 | 1/1973 | Day | 317/234 A |

*Primary Examiner*—Darrell L. Clay

[57] ABSTRACT

A high current interconnection is provided in a microcircuit package comprising first and second contacts each bonded to a substrate mounted in a package interconnected by a high current wire. The contacts are discrete pads of beryllium oxide and the high current wire is formed of Nichrome which is welded at its ends to a conductive surface layer provided on each pad. The wire is bowed away from the substrate for thermal stress relief.

1 Claim, 2 Drawing Figures

PATENTED SEP 17 1974 3,836,697

INVENTOR:
WARREN J. SCHULTZ,
BY Robert P. Coogan
HIS ATTORNEY.

HIGH CURRENT INTERCONNECTION ASSEMBLY IN A MICROCIRCUIT PACKAGE

BACKGROUND OF THE INVENTION

This invention relates to semiconductor device making. More specifically, it relates to provision of high current interconnection in a hybrid microcircuit.

In the manufacture of high power hybrid microcircuits, it is necessary to provide a high power, high current interconnection either between microcircuit devices or microcircuit devices and conductors of the package. (It should be noted that in the microcircuit art, high power and high current are in the order of magnitude of ten watts and several amps respectively.) In the past, high current interconnections have been provided by forming a thick film of platinum-gold or platinum-silver, for example, on a substrate. While this method is satisfactory to perform the function, a film high current interconnection requires a certain amount of space. In addition, the high current interconnection is included in a package which must be mounted on a heat sink since it is dissipating a relatively large amount of power. In both airborne and spaceborne equipment, size of any component is a critical consideration. The size of the component which must be mounted on a heat sink is even more critical, since heat sink space in airborne and spaceborne equipment is even more limited than in other equipment.

SUMMARY OF THE INVENTION

It is, therefore, an object of the present invention to provide a high current interconnect assembly in a microcircuit package which assembly requires less space per amount of current to be coupled than film interconnections.

It is also an object of the present invention to provide a high current interconnect assembly in a microcircuit package providing greater power dissipation per unit size than film interconnect assemblies.

Briefly stated, in accordance with the present invention a high current interconnection is provided in a microcircuit package comprising first and second contacts each bonded to a substrate mounted in a package interconnected by high current wire.

BRIEF DESCRIPTION OF THE DRAWINGS

The foregoing objects and features of novelty are embodied in the means recited with particularity in the claims forming the concluding portion of the specification. The invention, both as to its organization and manner of operation may be further understood by reference to the following description taken into connection with the following drawings.

Of the drawings.

DESCRIPTION OF THE PREFERRED EMBODIMENT

Figure 1:
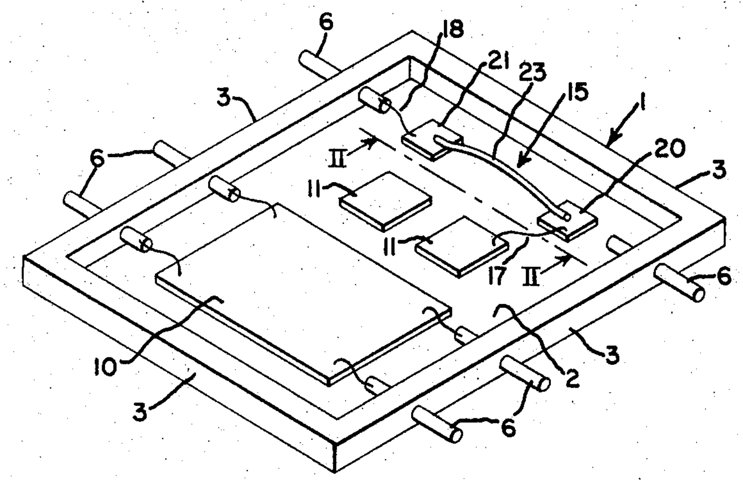
FIG. 1 is an illustration of a microcircuit package utilizing the present invention.

Referring now to FIG. 1, there is illustrated a conventional microcircuit package 1 having a base 2 surrounded by walls 3 and which is closed by a cover (not shown). The package 1 may contain, for example, a voltage regulator for connection to external components and a load by means of terminals 6 which extend through the walls 3. The microcircuitry consists of a microcircuit component 10, shown in stylized form for simplicity of the drawing, which may consist of deposited circuits and devices and includes gold filament leads for connection to selected ones of the terminals 6. Power transistors 11 are also mounted to the base 2, and one power transistor is coupled to a high current interconnect assembly 15 constructed in accordance with the present invention. A lead 17 connects one of the power transistors 11 to one contact 20 of the high current interconnect assembly 15; a lead 18 connects another contact 21 to one of the terminals 6. It should be noted that the high current interconnect assembly 15 could be used to provide other interconnections within a microcircuit package, for example, between first and second power transistors 11, or between first and second terminal 6 as well as between a power transistor 11 and a terminal 6 as illustrated in FIG. 1.

Figure 2:
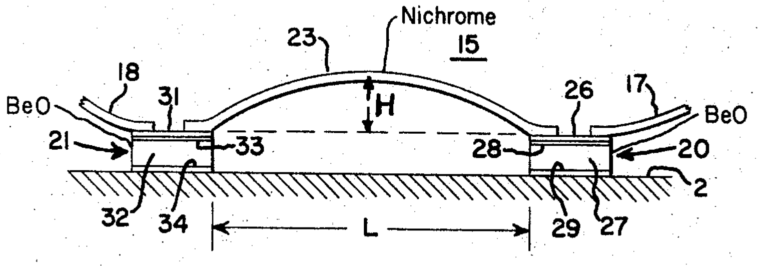
FIG. 2 is a cross section of the high current interconnection assembly incorporated in the microcircuit package of FIG. 1.

Referring now to FIG. 2, the interconnect assembly is illustrated in greater detail. FIG. 2 is a cross section of the microcircuit package 1 taken along the line 11—11 of FIG. 1. The contacts 20 and 21 are mounted in spaced relationship on the base 2 to support a high current wire 23. By a high current wire, it is meant that the wire 23 is of an appropriate material and sufficient dimension to carry a current which is high with respect to the hybrid microcircuit art. The wire 23 may be Nichrome, for example, in order to serve as both a conductor and as a resistor component. Alternatively, the high current wire 23 may be made of copper, silver or other highly conductive metal to provide minimal resistance. The contacts 20 and 21 are spaced so that a desired length of the wire 23 is provided to give a desired resistance.

In the preferred embodiment, the wire 23 has a bend in it which may be defined by a H/L ratio. H is defined by the distance from the top of the contact to the inner diameter of the wire and L is defined as the distance between contacts. This bend provides stress relief. For a nominal Nichrome resistor wire it has been found that a satisfactory H/L equals 0.15. An H/L of at least 0.05 should be provided for stress relief due to thermal expansion.

In the preferred embodiment, the contact 20 consists of an alloy plate 26, preferably consisting of Kovar, to which the wire 23 and lead 17 are welded. Welding provides an electrical connection having the necessary strength to withstand severe mechanical shocks. The plate 26 is electrically and thermally coupled to the base 2 and electrically isolated therefrom by a substrate 27, which may conveniently comprise beryllium oxide and which is preferably gold plated. The beryllium oxide substrate 27 is bonded to the plate 26 and base 2 by respectively well-known materials, for example, by gold-germanium-arsenic preforms 28 and 29. Similarly, the contact 21 comprises a Kovar plate 31 to which the wire 23 and lead 18 are bonded and a substrate 32 which is bonded to the plate 31 and base 2 by preforms 33 and 34 respectively. Using the materials as specified for the preferred embodiment, a thermal path from the ends of the wire 23 to the base 2 having a junction-to-case conductivity sufficient to dissipate heat produced by high power is provided.

The present invention thus provides a high power interconnection within a microcircuit package carrying more current per unit space and dissipating more power unit space than prior arrangements.

What is claimed as new and desired to be secured by Letters Patent of the United States is:

1. Apparatus for providing a high current conduction path for microcircuit elements mounted on a base substrate comprising, in combination:

a pair of spaced-apart discrete beryllium oxide pads bonded to said base with a thermally conductive bonding material;

a layer of electrically conductive material provided on the surface of said pads opposite said bonded surface;

a wire of relatively high electrical conductivity welded at each end to the respective conduction surfaces of said pads and bowed upwardly away from said base to provide thermal stress relief; and conduction means connected to the conductive surfaces of said pads for coupling current to and from said apparatus.

* * * * *